United States Patent
Wu et al.

(10) Patent No.: US 6,639,946 B2
(45) Date of Patent: Oct. 28, 2003

(54) SIGMA DELTA MODULATOR WITH SAW FILTER

(75) Inventors: Miaochen Wu, Acton, MA (US); Aria Eshraghi, Waltham, MA (US); Theodore Tewksbury, Boston, MA (US)

(73) Assignee: International Business Machines Corporation, Armonk, NY (US)

( * ) Notice: Subject to any disclaimer, the term of this patent is extended or adjusted under 35 U.S.C. 154(b) by 91 days.

(21) Appl. No.: 09/726,421

(22) Filed: Dec. 1, 2000

(65) Prior Publication Data

US 2002/0067770 A1 Jun. 6, 2002

(51) Int. Cl.[7] .............................................. H04B 14/06
(52) U.S. Cl. ...................................... 375/247; 341/143
(58) Field of Search ................................ 375/245, 247, 375/248, 254, 151, 153, 316, 346, 350, 355, 285; 341/143, 144, 155, 156, 157, 141, 77, 110, 142, 152, 166; 708/307, 313.05

(56) References Cited

U.S. PATENT DOCUMENTS

| | | | |
|---|---|---|---|
| 5,442,353 A | | 8/1995 | Jackson |
| 5,572,264 A | | 11/1996 | Mizukami et al. |
| 5,619,536 A | | 4/1997 | Gourgue |
| 5,734,683 A | | 3/1998 | Hulkko et al. |
| 5,736,950 A | * | 4/1998 | Harris et al. ............... 341/143 |
| 5,903,825 A | | 5/1999 | Goode et al. |
| 5,914,685 A | | 6/1999 | Kozlov et al. |
| 5,956,098 A | | 9/1999 | Mizukami et al. |
| 6,005,506 A | * | 12/1999 | Bazarjani et al. ............ 341/143 |
| 6,087,969 A | * | 7/2000 | Stockstad et al. ........... 341/143 |
| 6,121,910 A | * | 9/2000 | Khoury et al. ............... 341/143 |
| 6,160,859 A | * | 12/2000 | Martin et al. ............... 341/143 |
| 6,218,972 B1 | * | 4/2001 | Groshong ................... 341/143 |
| 6,326,911 B1 | * | 12/2001 | Gomez et al. ............... 341/131 |
| 6,329,939 B1 | * | 12/2001 | Swaminathan et al. ...... 341/143 |
| 6,362,762 B1 | * | 3/2002 | Jensen et al. ................ 341/141 |
| 6,369,730 B1 | * | 4/2002 | Blanken et al. ............. 341/143 |
| 6,393,070 B1 | * | 5/2002 | Reber .......................... 375/340 |
| 6,417,746 B1 | * | 7/2002 | Johnson .................. 310/313 B |
| 6,459,743 B1 | * | 10/2002 | Lipka .......................... 375/329 |

FOREIGN PATENT DOCUMENTS

JP         10-285067         10/1998

* cited by examiner

*Primary Examiner*—Chi Pham
*Assistant Examiner*—Khanh Cong Tran
(74) *Attorney, Agent, or Firm*—Connollyn Bove Lodge & Hutz LLP

(57) ABSTRACT

A sigma delta modulation device and method for filtering high frequency intermediate frequency signals. A summing amplifier receives the analog intermediate frequency signal, and provides to a surface acoustic wave filter (SAW) an analog signal which is to be converted to a digital quantity. A quantizer digitizes the signal to produce a digitized intermediate frequency signal. A digital to analog converter provides a feedback signal from the quantizer output signal, to the summing amplifier to form a sigma delta modulation device. The SAW filter provides for high stop band attenuation of signal images within the intermediate frequency signal, and produces a low noise signal with substantially no intermodulation products.

10 Claims, 2 Drawing Sheets

SIGMA DELTA MODULATOR WITH SAW FILTER

FIELD OF THE INVENTION

Background of the Invention

The present invention relates to the radio communications art. Specifically, a sigma delta modulator is described for processing the entire bandwidth of the cellular telephone GSM spectrum.

High speed analog to digital converters (ADC) are utilized to process higher IF frequency signals. In the portable telephone art, sigma delta modulators are used in analog to digital converters. The sigma delta ADCs receive an analog input signal which is subtracted from a feedback signal to produce an error signal. The resulting error signal is filtered and digitized using a digital quantizer. The resulting quantized signal is reconverted to an analog signal, and used as the feedback signal. The basic sigma delta analog to digital converter provides higher resolution because of higher clocking speeds which over sample the input signal. The basic sigma delta ADC also provides a signal having a high signal to noise ratio through the use of a low pass filter (or band pass filter) which shapes the quantization noise frequency spectrum to fall outside the frequency band of the quantized signal.

In radio telephone communications applications, it is desirable to process signals over the entire GSM intermediate frequency band. The IF frequency signal produced from frequency down conversion may include images produced from the down conversion process which are desirably removed to avoid any false signal detection.

The prior art employs various filtering circuits in the sigma delta modulation system. On chip integrated filters, however, produce noise and distortion at high intermediate frequency signals. The filters used in the delta sigma modulators include switched capacitors (SC), inductor/capacitors (LC), transconductance/capacitor (gm-c), active resistor/capacitors (RC) and MOS capacitor-type filters. FIG. 1 illustrates one type of off chip LC loop filter.

These filters which are necessary to remove images, and maintain a low noise/distortion of the intermediate frequency, may require a costly manual tuning process. Additionally, it is difficult to design gm-C filters that are highly linear, and which introduce minimal noise to the signal processing of the intermediate frequency signals. These problems are compounded by the higher frequencies i.e., above hundreds of megahertz frequency range utilized in the radio telecommunications art. The amplitude and phase nonlinearity of these filters can produce intermodulation products from signals within the intermediate frequency band. Accordingly, it is desirable to provide a filter for the sigma delta modulator which produces a low noise level, and has a low distortion output at higher intermediate frequency signal frequencies.

SUMMARY OF THE INVENTION

An analog-to-digital converter is described for processing intermediate frequency signals above the hundreds of megahertz range. The analog-to-digital converter is implemented as a sigma delta modulator which produces from an analog input signal a digitized output signal. The apparatus in accordance with the invention provides a signal delta modulator which receives on an input of a summing amplifier the analog intermediate frequency signal. The summing amplifier also receives a feedback signal derived from the digitized intermediate frequency signal. A surface acoustic wave filter (SAW) filters the signal from the summing amplifier, and eliminates image signals which were produced during the down conversion process. The SAW filter has a sufficient bandwidth to accommodate the entire GSM intermediate frequency spectrum and produced an image free, low noise output signal.

The SAW filter output signal is amplified and applied to a quantizer where it is digitized. A feedback loop is formed from the output of the quantizer circuit, and a second input of the summing amplifier. The feedback signal is provided by a digital to analog converter which converts the digitized intermediate frequency signal to an analog signal, and provides the analog signal as a feedback signal for the summing amplifier.

The SAW filter does not include any of the disadvantages of the traditional filtering techniques used in sigma delta modulators. Pass bandwidth, stop band attenuation, and bandwidth ripple are easily met using the SAW filter. Additionally, the SAW filter does not introduce any significant noise, or distortion products at the higher frequency intermediate frequency signals.

DESCRIPTION OF THE PREFERRED EMBODIMENT

Figure 1:
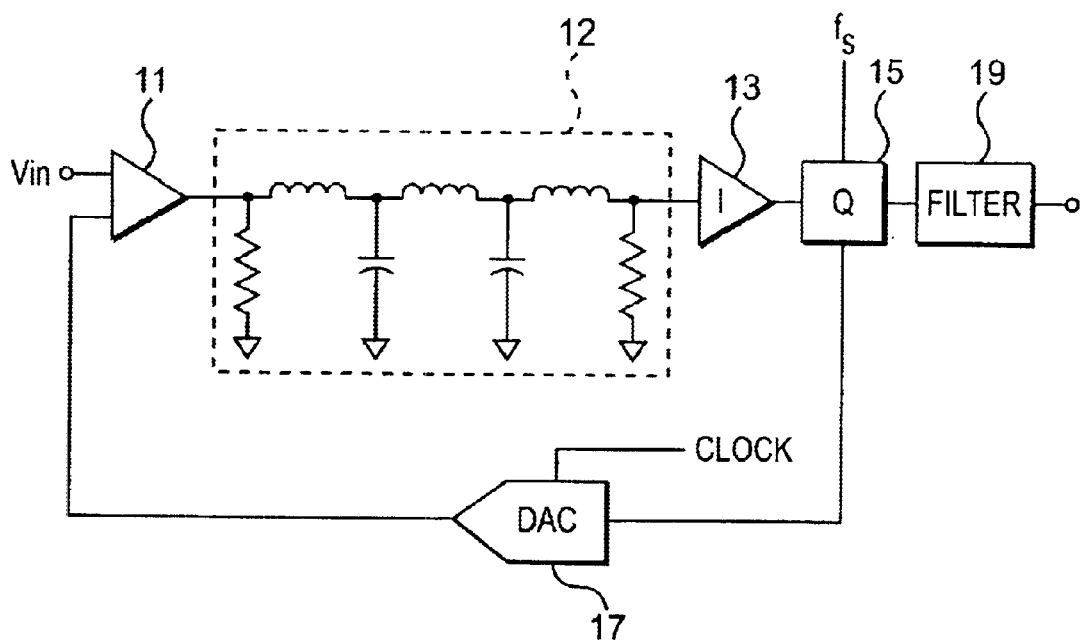
FIG. 1 illustrates the prior art sigma delta modulator used as an analog to digital converter.

Referring now to FIG. 1, there is shown a sigma delta modulator for providing a digital to analog converter which digitizes high frequency intermediate frequency signals. A summing amplifier 11 receives on its non-inverting input the intermediate frequency analog signal, and supplies a difference signal, corresponding to the difference between a feedback signal, supplied to the inverting input, and the analog intermediate frequency signal. The output signal is filtered by a loop filter 12, which is a multi-pole LC low pass filter arrangement. The low pass filter 12 reduces the amplitude of image signals which maybe contained in the intermediate frequency signal above the intermediate frequency signal band width. In the case of a LC filter, however, an integrated circuit can hardly achieve a good Q factor. Discrete LC components also have matching and available value problems. While in the example of FIG. 1, an LC type filter arrangement is illustrated, other types of filtering techniques may be employed, such as the traditional gm-C filters, or a switched capacitor (SC) filter.

The output of the filter circuit 12 is amplified in a buffer amplifier 13 to an amplitude level which may be quantized by quantizer 15. Quantizer 15 receives an input clock signal FS which samples the input analog signal and provides a digital output signal to a decimation filter 19. The quantizer output signal is also applied to a digital to analog converter 17. Digital to analog converter 17 samples the quantized digital signal, and provides the feedback signal for summing amplifier 11.

The prior art sigma delta modulator has significant limitations when implemented in higher frequency communication applications such as cellular telephones. When attempting to filter the entire GSM band intermediate frequency signal, which is centered at an IF frequency of 160 MHz, the delta sigma modulator suffers from increased noise and distortion due to the use of filters 12, be they inductor capacitor filters, transconductance capacitor filters, switched capacitor filter, or other known prior art filtering techniques. Additionally, when the inductor/capacitor (LC) low pass filters are utilized, significant manual tuning and operator time is necessary to adjust the filters. The transconductance capacitor gm-c filter, also used in the prior art, provides additional problems because of the nonlinear phase and amplitude response creating inter modulation products within the intermediate frequency signal pass band.

Figure 2:
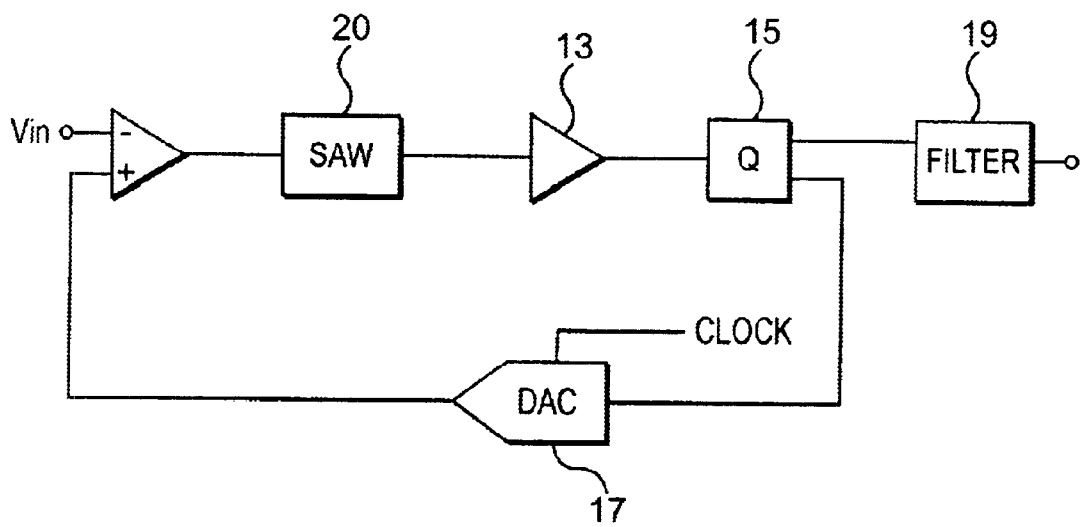
FIG. 2 illustrates, in accordance with a preferred embodiment of the invention, a sigma delta modulator using a SAW filter.

FIG. 2 represents an improvement in the sigma delta modulator design in accordance with the preferred embodiment of the invention, especially for intermediate frequency signals above 100 MHz. Each of the components shown in FIG. 2 which correspond to the same numbered components of FIG. 1 perform the same function, and are not further described. The surface acoustic wave (SAW) filter 20 has a passband filter characteristic which is centered about the intermediate frequency. In a GSM cellular telephone application, an IF center frequency of 160 MHz, having a 25 MHz signal bandwidth, can be provided by a SAW filter 20. The SAW filter 20 advantageously can be designed to have a band pass output attenuation ripple of 0.01 db, and a stop band attenuation of −60 db. The SAW filter 20 provides for the advantage of low noise distortion properties at high IF signal frequencies which carry high speed data. The high stop band attenuation provides for significant image signal suppression in the intermediate frequency signal, while having low attenuation over the pass band width of interest.

The output of the quantizer 15, bearing a digital signal representing an input intermediate frequency signal, is further filtered using a digital decimation filter 19. The decimation filter eliminates the quantizing noise produced from the quantizer 15. Quantizer 15 is operated at a known sampling rate, FS, which is proportionate to the frequency of the intermediate frequency signal. While the sigma delta modulator using the SAW filter has been described with respect to an implementation for processing an intermediate frequency signal, other high frequency applications, such as receivers having an IF frequency above 100 MHz, can be implemented to achieve similar results.

Figure 3:
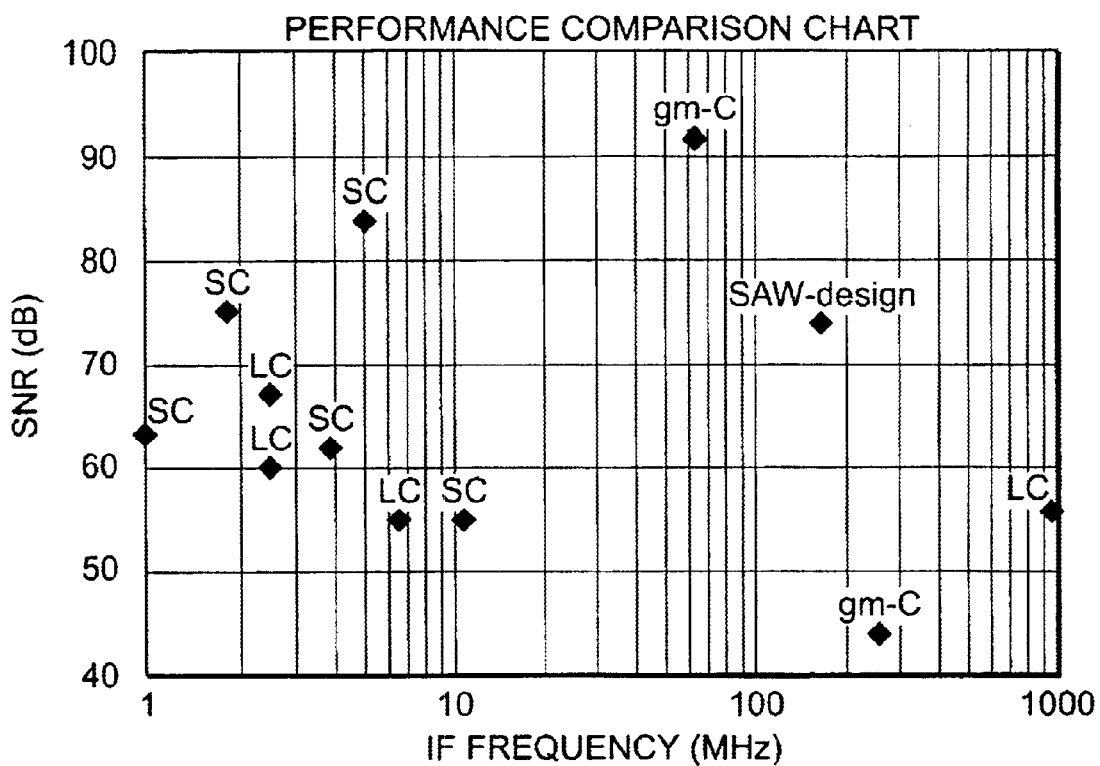
FIG. 3 illustrates the relative signal-to-noise ratio of a signal produced from the embodiment of FIG. 2 as well as the prior art device of FIG. 1.
Figure 4:
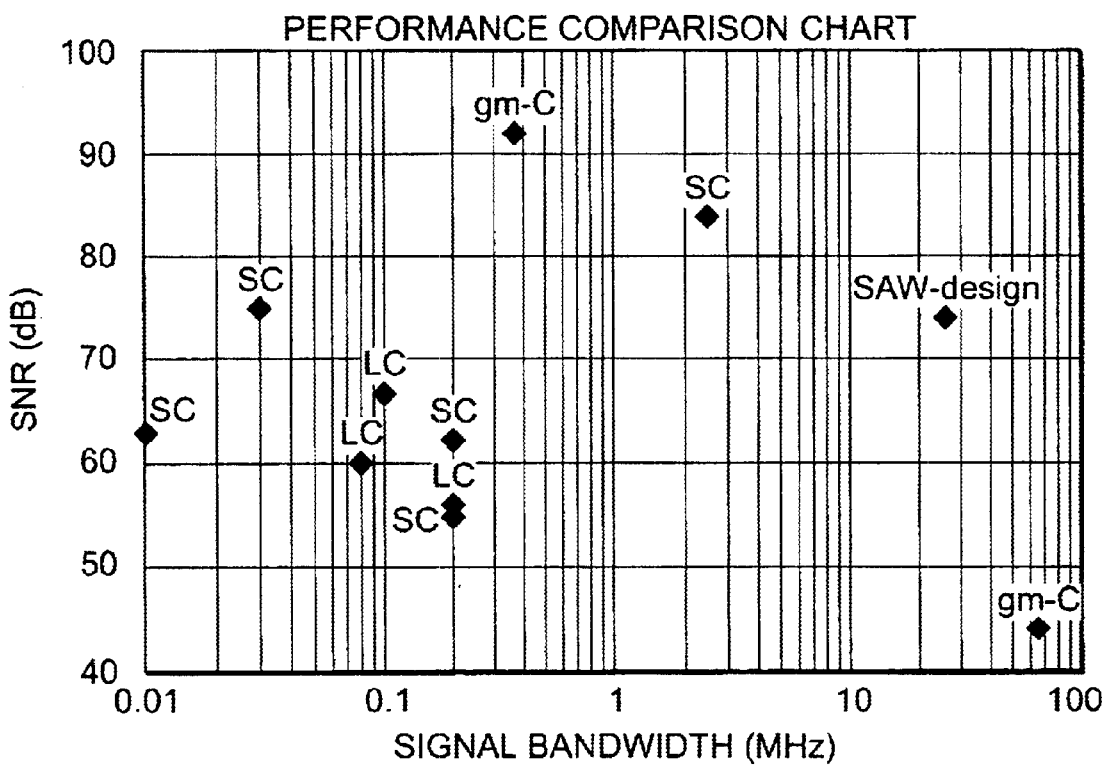
FIG. 4 illustrates the signal to noise ratio performance as a function of bandwidth for the embodiment of FIG. 2 and for prior art devices which do not use a SAW filter.

The improvements to system performance are illustrated in FIGS. 3 and 4. FIG. 3 illustrates the signal to noise ratio of intermediate frequency signals processed by the embodiment of FIG. 2. The signal to noise ratio exceeds that of an LC healthy low pass filter used in FIG. 1, and a transconductance/capacitance filter at (gm-C) at higher frequencies.

A similar performance advantage is illustrated in FIG. 4 which demonstrates the signal-to-noise ratio over a significant higher band width above 10 MHz. Above 10 MHz, the SAW filter provides for improved signal-to-noise ratio over the transconductance/capacitance filter, and significant improvements over the inductor capacitance filter operating at the lower signal band widths, as well as improvements over the switched capacitor (SC).

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A sigma delta modulation device for filtering high frequency intermediate signals, comprising:
   a summing amplifier for receiving an analog intermediate frequency signal;
   a SAW filter connected to receive a signal from said summing amplifier of at least 25 MHz, a center frequency of 109 MHz and a stop band of 60 db, said SAW filter providing a bandwidth for eliminating image frequencies contained in said analog intermediate frequency signal;
   a buffer amplification circuit for amplifying a signal produced from said SAW filter;
   a quantizer for digitizing a signal from said buffer to produce a digitized intermediate frequency signal; and
   a digital to analog converter connected to received said digitized intermediate frequency signal, and to apply an analog output voltage as a feedback signal to said summing amplifier.

2. The sigma delta modulation device according to claim 1 wherein said SAW filter has a stop band attenuation greater than 60 db.

3. The sigma delta modulation device according to claim 1 further comprising a decimation filter connected to receive the output signal from said quantizer.

4. A method for converting high frequency analog intermediate frequency signals to digital signals, comprising:
   amplifying said intermediate frequency analog signal;
   filtering said analog signal in a SAW filter having a center frequency rater than 100 MHz, and a bandwidth of 25 MHz to remove image signals contained in said analog signal, wherein said filtering of said analog signal through said SAW filter produces a band pass signal which is attenuated outside of a bandpass frequency range which is at least 60 db below signals within said bandpass frequency range;
   amplifying said filtered analog signal;
   quantizing said amplified analog signal;
   decimating the quantized digital signal wherein a filtered digital intermediate frequency signal is produced;
   converting said quantized signal into an analog signal; and
   combining said converted quantized signal with said intermediate frequency signal.

5. The method according to claim 4 wherein said bandpass frequency range is centered about a frequency which is greater than 100 MHz.

6. The method according to claim 5 wherein said IF frequency signal is centered at approximately 160 mhz and said bandpass frequency range is at least 25 mhz.

7. The method according to claim 4 wherein said filter bandpass frequency range produces a signal having an attenuation less than 0.01 db.

8. A sigma delta modulation device for filtering high frequency intermediate signals, comprising:

a summing amplifier for receiving an analog intermediate frequency signal;

a SAW filter connected to receive a signal from said summing amplifier, said SAW filter providing a bandwidth for eliminating image frequencies contained in said analog intermediate frequency signal, said SAW filter having a stop band attenuation of greater than 60 db;

a buffer amplification circuit for amplifying a signal produced from said SAW filter;

a quantizer for digitizing a signal from said buffer to produce a digitized intermediate frequency signal; and a digital to analog converter connected to receive said digitized intermediate frequency signal, and to apply an analog output voltage as a feedback signal to said summing amplifier.

9. The device as claimed in claim 8, further comprising a decimation filter connected to receive the output signal from said quantizer.

10. The device as claimed in claim 8, wherein said SAW filter has a band pass output attenuation ripple of 0.1 db.

* * * * *